(12) United States Patent
Hafez et al.

(10) Patent No.: US 11,764,260 B2
(45) Date of Patent: *Sep. 19, 2023

(54) DIELECTRIC AND ISOLATION LOWER FIN MATERIAL FOR FIN-BASED ELECTRONICS

(71) Applicant: Tahoe Research, Ltd., Dublin (IE)

(72) Inventors: Walid M. Hafez, Portland, OR (US); Chia-Hong Jan, Portland, OR (US)

(73) Assignee: Tahoe Research, Ltd., Dublin (IE)

( * ) Notice: Subject to any disclaimer, the term of this patent is extended or adjusted under 35 U.S.C. 154(b) by 12 days.

This patent is subject to a terminal disclaimer.

(21) Appl. No.: 17/493,213

(22) Filed: Oct. 4, 2021

(65) Prior Publication Data

US 2022/0102488 A1 Mar. 31, 2022

Related U.S. Application Data

(60) Continuation of application No. 16/918,952, filed on Jul. 1, 2020, now Pat. No. 11,139,370, which is a
(Continued)

(51) Int. Cl.
*H01L 29/06* (2006.01)
*H01L 29/40* (2006.01)
(Continued)

(52) U.S. Cl.
CPC ........ *H01L 29/0649* (2013.01); *H01L 27/098* (2013.01); *H01L 29/0657* (2013.01);
(Continued)

(58) Field of Classification Search
CPC ............. H01L 29/0649; H01L 29/0657; H01L 29/404; H01L 29/66166; H01L 29/66803;
(Continued)

(56) References Cited

U.S. PATENT DOCUMENTS 7,235,436 B1 6/2007 Lin et al.
7,560,784 B2 7/2009 Cheng
(Continued)

FOREIGN PATENT DOCUMENTS

CN 102956692 3/2013
JP 06-260647 9/1994
(Continued)

OTHER PUBLICATIONS

Extended European Search Report for European Patent Application No. 14897867.9 dated Feb. 26, 2018, 6 pgs.
(Continued)

*Primary Examiner* — Tu-Tu V Ho
(74) *Attorney, Agent, or Firm* — Studebaker & Brackett PC

(57) ABSTRACT

A dielectric and isolation lower fin material is described that is useful for fin-based electronics. In some examples, a dielectric layer is on first and second sidewalls of a lower fin. The dielectric layer has a first upper end portion laterally adjacent to the first sidewall of the lower fin and a second upper end portion laterally adjacent to the second sidewall of the lower fin. An isolation material is laterally adjacent to the dielectric layer directly on the first and second sidewalls of the lower fin and a gate electrode is over a top of and laterally adjacent to sidewalls of an upper fin. The gate electrode is over the first and second upper end portions of the dielectric layer and the isolation material.

23 Claims, 11 Drawing Sheets

Related U.S. Application Data continuation of application No. 16/435,250, filed on Jun. 7, 2019, now Pat. No. 10,741,640, which is a division of application No. 15/885,468, filed on Jan. 31, 2018, now Pat. No. 10,355,081, which is a continuation of application No. 15/409,065, filed on Jan. 18, 2017, now Pat. No. 9,899,472, which is a continuation of application No. 15/121,879, filed as application No. PCT/US2014/046525 on Jul. 14, 2014, now Pat. No. 9,842,944.

(51) Int. Cl.
*H01L 29/66* (2006.01)
*H01L 29/808* (2006.01)
*H01L 29/8605* (2006.01)
*H01L 27/098* (2006.01)

(52) U.S. Cl.
CPC ...... *H01L 29/404* (2013.01); *H01L 29/66166* (2013.01); *H01L 29/66803* (2013.01); *H01L 29/66901* (2013.01); *H01L 29/808* (2013.01); *H01L 29/8605* (2013.01)

(58) Field of Classification Search
CPC ............. H01L 29/66901; H01L 29/808; H01L 29/8605; H01L 27/098
USPC ....................................................... 257/272
See application file for complete search history.

(56) References Cited

U.S. PATENT DOCUMENTS

| | | |
|---|---|---|
| 9,299,840 B2 | 3/2016 | Xu |
| 9,431,497 B2 | 8/2016 | Toh |
| 9,768,256 B2 | 9/2017 | Tsai |
| 9,899,472 B2 | 2/2018 | Hafez |
| 2002/0011612 A1 | 1/2002 | Hieda |
| 2011/0049613 A1 | 3/2011 | Yeh et al. |
| 2011/0180871 A1 | 7/2011 | Anderson et al. |
| 2012/0168913 A1 | 7/2012 | Toh et al. |
| 2012/0256238 A1 | 10/2012 | Ning et al. |
| 2013/0043536 A1 | 2/2013 | Rahim et al. |
| 2014/0117462 A1 | 5/2014 | Cheng et al. |
| 2014/0160868 A1 | 6/2014 | Widjaja et al. |
| 2014/0353715 A1 | 12/2014 | Xiao |
| 2016/0133696 A1 | 5/2016 | Yin |

FOREIGN PATENT DOCUMENTS

| | | |
|---|---|---|
| JP | 2005-174964 | 6/2005 |
| JP | 2006-216833 | 8/2006 |
| JP | 2011-040768 | 2/2011 |
| JP | 2011-97058 | 5/2011 |

OTHER PUBLICATIONS

Extended European Search Report for European Patent Application No. 17196788.8 dated Feb. 26, 2018, 6 pgs.
Notice of Reasons for Rejection for Japanese Patent Application No. 2016-568050 dated Mar. 20, 2018, 5 pgs., with English machine translation.
Notice of Allowance for Japanese Patent Application No. 2016-568050, dated Aug. 7, 2018, 1 pages.
PCT International Search Report and Written Opinion of the International Searching Authority dated Apr. 17, 2015, 13 pages.
International Preliminary Report on Patentability for International Patent Application No. PCT/US2014/046525, dated Jan. 26, 2017, 12 pages.
Office Action for Taiwan Patent Application No. 104118477 dated Mar. 14, 2016, 4 pgs., no translation.
Office Action for Taiwan Patent Application No. 104118477 dated Aug. 25, 2016, 4 pgs., with English translation.
Office Action for Taiwan Patent Application No. 104118477 dated Jan. 23, 2017 6 pgs., with English translation.
Office Action and Search Report for Taiwan Patent Application No. 106111403 (including translation), dated Aug. 1, 2017, 11 pgs.
Notice of Allowance for Taiwan Patent Application No. 106111403, dated Mar. 13, 2018, 2 pages.
Office Action for Taiwan Patent Application No. 107111952, dated Jul. 12, 2018, 10 pages.
Notice of Allowance for Taiwan Patent Application No. 107111952, dated Mar. 8, 2019, 1 page.
Office Action from Chinese Patent Application No. 201480079891.2, dated Oct. 31, 2019, 12 pgs.
Office Action from Malaysian Patent Application No. PI2016704571, dated Aug. 7, 2019, 3 pgs.
Office Action from European Patent Application No. 17196788.8, dated Apr. 23, 2020, 5 pgs.
Office Action from European Patent Application No. 14897867.9, dated Apr. 22, 2020, 4 pgs.
Office Action from Chinese Patent Application No. 201480079891.2, dated May 20, 2020, 3 pgs.
Office Action from Korean Patent Application No. 10-2016-7034750, dated Jul. 25, 2020, 10 pgs.
Notice of Allowance from Chinese Patent Application No. 201480079891.2, dated Sep. 30, 2020, 4 pgs.
Notice of Allowance from Korean Patent Application No. 10-2016-7034750, dated Jan. 12, 2021, 2 pgs., no translation.

DIELECTRIC AND ISOLATION LOWER FIN MATERIAL FOR FIN-BASED ELECTRONICS

CROSS-REFERENCE TO RELATED APPLICATION

The present application is a continuation of U.S. patent application Ser. No. 16/918,952, filed Jul. 1, 2020, which is a continuation of U.S. patent application Ser. No. 16/435,250, filed Jun. 7, 2019, not U.S. Pat. No. 10,741,640, issued on Aug. 11, 2020, which is a divisional of U.S. patent application Ser. No. 15/885,468, filed Jan. 31, 2018, now U.S. patent Ser. No. 10/355,081, issued on Jul. 16, 2019, which is a continuation of U.S. patent application Ser. No. 15/409,065, filed Jan. 18, 2017, now U.S. Pat. No. 9,899,472, issued on Feb. 20, 2018, entitled "DIELECTRIC AND ISOLATION LOWER FIN MATERIAL FOR FIN-BASED ELECTRONICS", which is a continuation of prior U.S. patent application Ser. No. 15/121,879, filed Aug. 26, 2016, now U.S. Pat. No. 9,842,944, issued on Dec. 12, 2017, entitled "SOLID-SOURCE DIFFUSED JUNCTION FOR FIN-BASED ELECTRONICS," by Walid M. Hafez, et al., which is a United States National Phase Application under 35 U.S.C. § 371 of International Application No. PCT/US2014/046525, filed Jul. 14, 2014, entitled "SOLID-SOURCE DIFFUSED JUNCTION FOR FIN-BASED ELECTRONICS," the priorities of which are hereby claimed and the contents of which are hereby incorporated by reference herein.

FIELD

The present disclosure relates to Fin-based electronics and, in particular to junctions using solid source diffusion.

BACKGROUND

Monolithic integrated circuits typically have a large number of transistors, such as metal-oxide semiconductor field-effect transistors (MOSFETs) fabricated over a planar substrate, such as a silicon wafer. System-on-a-chip (SoC) architectures use such transistors in both analog and digital circuitry. When high-speed analog circuitry is integrated on a single monolithic structure with digital circuitry, the digital switching can induce substrate noise that limits the precision and linearity of the analog circuitry.

Junction gate field effect transistors (JFETs) are used primarily in analog applications due to the superior low noise performance they offer compared to standard MOSFET (Metal Oxide Semiconductor FET) devices. JFETs are useful in radio frequency devices such as filters and equalizers and also in power circuits for power supplies, power conditioners and the like.

JFET transistors are fabricated in the bulk of a planar process technology using implanted junctions to establish a back-gate, channel, and top-gate electrodes. The JFET is made using implanted n and p-type wells to form the top and back gates, as well as the source and drain contacts. This bulk planar process may be replaced for MOSFET devices using fins formed on the substrate. The formation of FET devices on fins has been referred to as a FinFET architecture.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

A high performance JFET may be fabricated on a fin of a FinFET process architecture. Because the electrical characteristics of a JFET rely on its structure as a bulk-transport device, a JFET device built on a fin in the same way as a MOSFET device loses its bulk transport and high current capabilities. A JFET can be built, however, using solid-source diffusion on a fin architecture to obtain a high-performance, scalable device for system-on-chip process technologies.

A similar technique may be used to form a variable resistor. A p-channel or n-channel may be formed in a fin with a contact on either side. A control gate may be formed over the channel in the fin between the two contacts. Due to the nature of current conduction inside of the fin and the narrow width of the fin, the control gate provides excellent electrostatic control of the carrier density inside the fin. By using this control gate, the carrier density can be increased (through channel accumulation) or decreased (though channel depletion) depending on the bias applied.

The same control gate technique may also be used on one or both sides of the gate of a JFET in a fin. The control gates act as a variable resistor built into the fin-based JFET architecture. As JFETs are typically longer channel devices to sustain high voltage operation, these control gates have no added layout area penalty and may improve the pinch-off voltage needed to fully shut off the channel.

Figure 1:
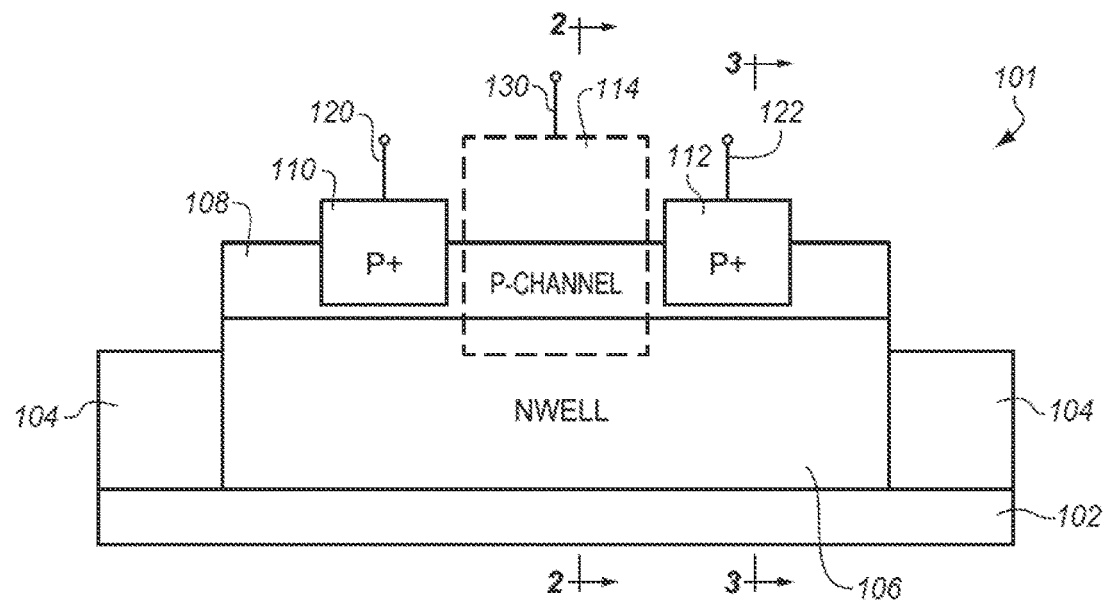
FIGS. 1-4 are cross-sectional side view and corresponding front view diagrams of a p-channel current flow control gate on a fin architecture according to an embodiment of the invention.

FIG. 1 is a cross-sectional side view diagram of a current flow control gate in FinFET architectures. It shows a portion of a fin on a substrate in a FinFET architecture. The fin 106, 108 protrudes from the substrate 102 which is covered in an isolation oxide 104. A device 101 is built on the substrate 102 and the fin. An n-well 106 is formed on the fin and may extend partially into the substrate and a p-type channel 108 has been formed over the n-well on the fin. The fin as shown is made up of these two parts, however, the fin may extend beyond the device and beyond the n-well and the p-channel on either side of the device. A pair of contacts 110, 112 is formed in the p-channel, one on each side of the channel. A control gate 114 is formed between the two contacts over the fin. Current flow from one channel contact 110 to the other channel contact 112 through the p-channel 108 is controlled by the control gate 114.

Figure 2:
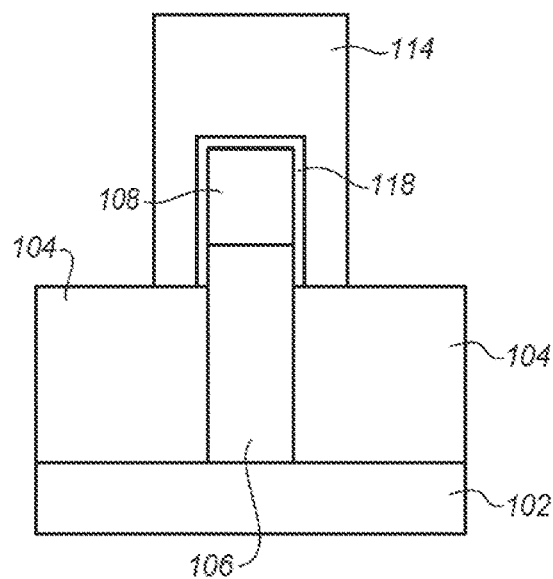

A part of the device 101 of FIG. 1 is shown in the cross-sectional front view diagram of FIG. 2. This view is taken as a cross-section through the control gate 114, through the line 2-2 of FIG. 1. As shown, the isolation oxide 102 and the n-well 106 are directly over the substrate 102. The p-channel 108 is formed over the n-well 106.

The control gate 114 is formed over and around the p-channel surrounding it on three sides. This allows the control gate to electrically pinch carrier flow through the p-channel between the two contacts 110, 112. The p-channel is surrounded by a barrier layer 118 between the p-channel and the control gate to prevent diffusion between the p-channel and the gate.

The n-well extends through the isolation oxide. The n-well also extends above and below the top of the isolation oxide 104. This allows the control gate to extend all the way around the p-channel to more effectively control carrier flow through the p-channel. As shown, the control gate extends deeper on the fin than does the p-channel. This ensures that the p-channel is more than completely enclosed on three sides. Alternatively, the gate may be made smaller to allow a leakage current through the p-channel even when the maximum voltage has been applied to the control gate.

Figure 3:
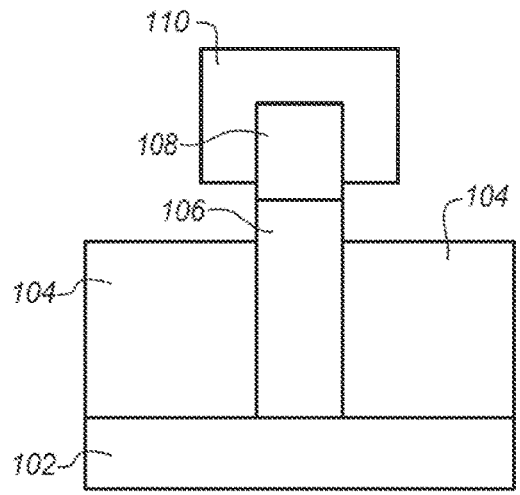

FIG. 3 is a cross-sectional front view diagram of the fin and device 101 of FIG. 1 taken through either one of the two contacts 110, 112 and in this example through line 3-3 of FIG. 1. As shown, the n-well is deep through the isolation oxide 104 to the substrate 102. The contact is formed over the p-channel 108 to provide a suitable connection from an external source to the p-channel. The contact does not extend over the n-well and is not as deep as the control gate 114. Electrodes 120 and 122 are formed on the two contacts 110, 112 so that a current may be applied to one or the other of the two contacts. The current flow between the two contacts is then controlled by the control gate.

Figure 4:
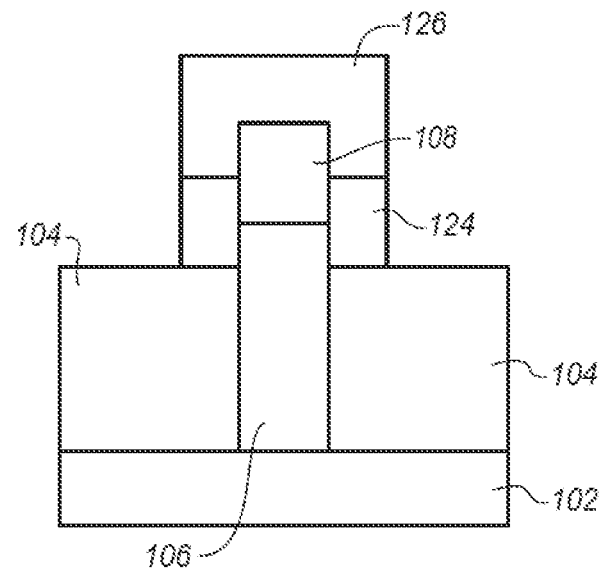

FIG. 4 is a cross-sectional front view diagram of an alternative contact 110-1. FIG. 4 presents the same view as FIG. 3 but for an alternative embodiment. The contact of FIG. 4 may be formed by adding an isolation oxide 124 to the contact of FIG. 3. The same isolation oxide 104 and n-well 106 are formed over a substrate 102 such as a silicon substrate. The p-channel 108 is built over the n-well 106 and the top is covered with a contact 110, 126, similar to the contact 110 of FIG. 3. In the example of FIG. 4 an additional fin spacer 124 is applied between the isolation oxide and the contact 126 to prevent diffusion from between the n-well and the p-type contact. In practice, the fin is first formed and then doped to form an n-well and p-channel. The fin spacer 124 is then built up around the fin with the doped contact 126 over it.

Figure 5:
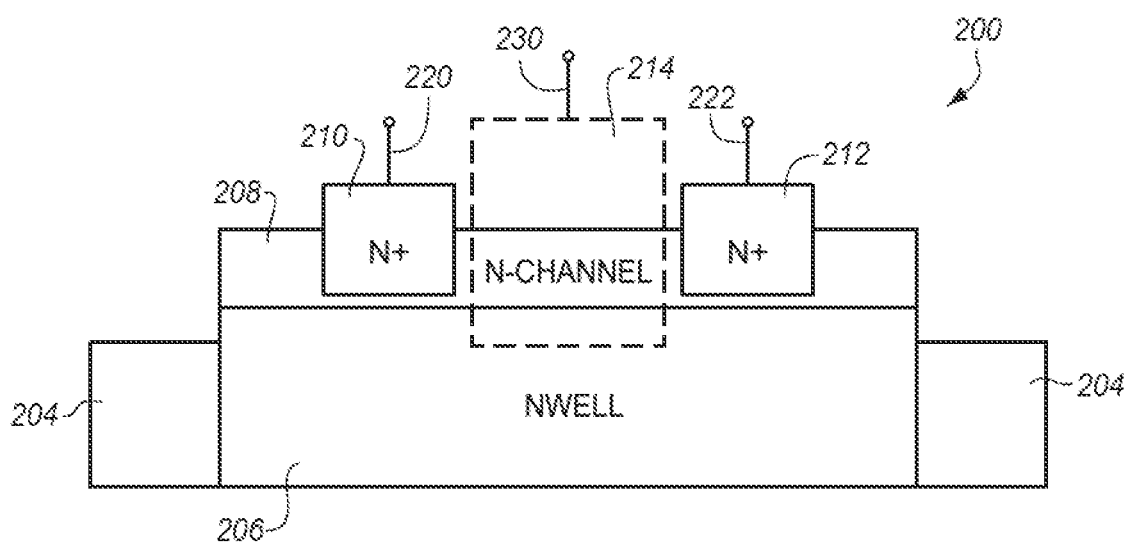
FIG. 5 is a cross-sectional side view diagram of an n-channel current flow control gate on fin architecture according to an embodiment of the invention.

FIG. 5 is a cross-sectional side view diagram of an n-channel variable current flow device in FinFET architecture. It shows an alternative variable resistor device 200 in which an n-channel is used instead of a p-channel. In this example no substrate is shown for simplicity, however, the device is formed using a FinFET architecture similar to the device of FIG. 1. A fin is built up over the substrate. The fin is doped to form a deep p-well 206. The fin is surrounded by an isolation oxide 204. The upper part of the fin is doped to form an n-channel 208 above the p-well 206.

A pair of contacts, in this case n-type contacts 210, 222, is formed one contact on either side of the n-channel. Electrodes 220, 224 are attached to the contacts to allow a current to be applied to one of the contacts. Flow through the n-channel 208 is controlled by a control gate 214 which has an electrode 230 to which a variable voltage may be applied. The variable resistor 200 of FIG. 2 operates similarly to the variable resistor 101 of FIG. 1. An increasing voltage applied to the terminal 230 allows more current to flow through the n-channel by the control gate 214. In this case, the current is in the form of electrons rather than holes, however, the fundamental operation is the same.

Figure 6:
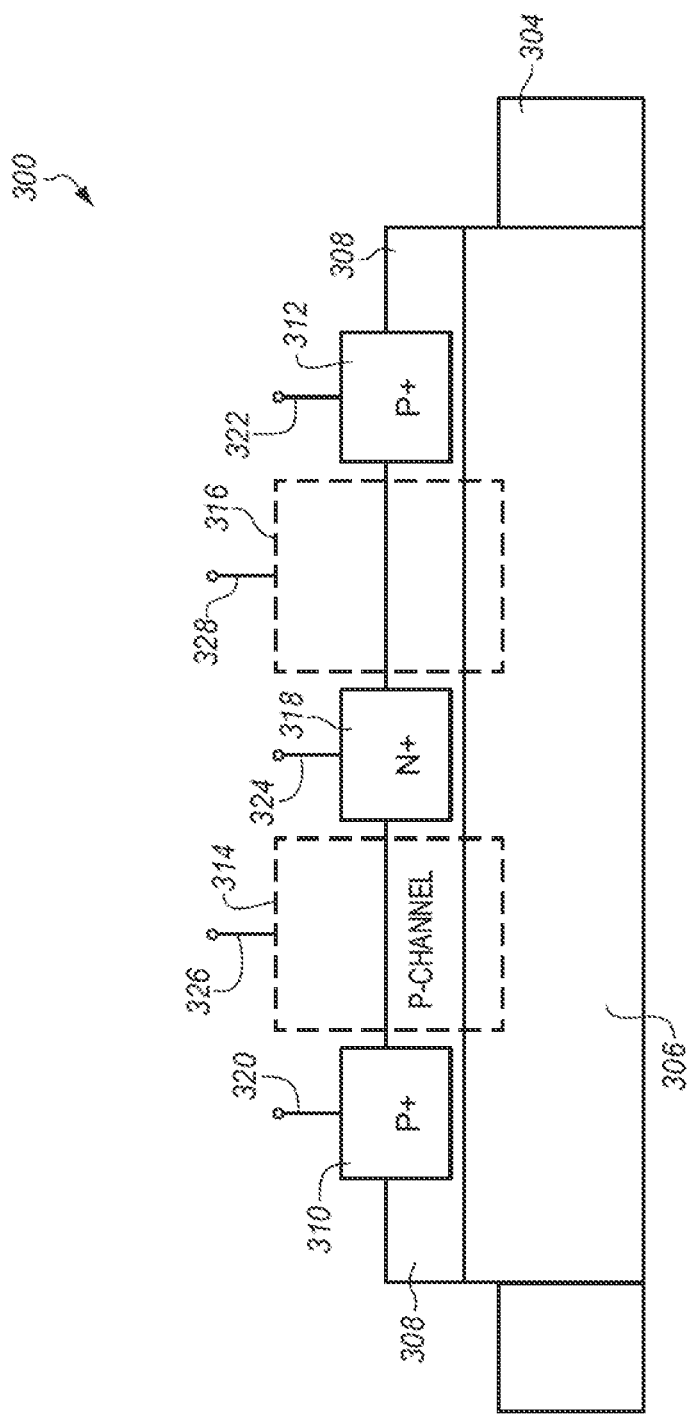
FIG. 6 is a cross-sectional side view diagram of a p-channel current flow control device with multiple gates on fin architecture according to an embodiment of the invention.

FIG. 6 is a cross-sectional side view diagram of a p-channel device with variable current flow controlled by multiple gates in FinFET architecture. P-type contacts 310, 312 as in FIG. 2 are combined with an n-type contact 318 to make a double gated p-type device 300. This device has a fin with a deep n-well 306. The upper part of the fin is doped as a p-channel 308 and the fin is surrounded by an isolation oxide 304. P-type contacts 310, 312 are formed at either end of the p-channel. An n-type contact 318 is formed between the two p-type channels. A first control gate 314 is placed between the left side p-type contact 310 and the center n-type contact 318. A second control gate 316 is placed between the n-type contact 318 and the right side p-type contact 312. The three contacts 310, 312, 318 each have a terminal 320, 324, 322 to which a current may be applied. The two control gates 314, 316 also have terminals 326, 328 to which a voltage may be applied. By controlling the voltage in one or both of the control gates, the current flow through the p-channel may be regulated. In addition, the n-type contact 318 may also be used to regulate current flow through the device 300. This three contact device allows for a very precise control of current flow which may be used for any of a variety of different purposes.

Figure 29:
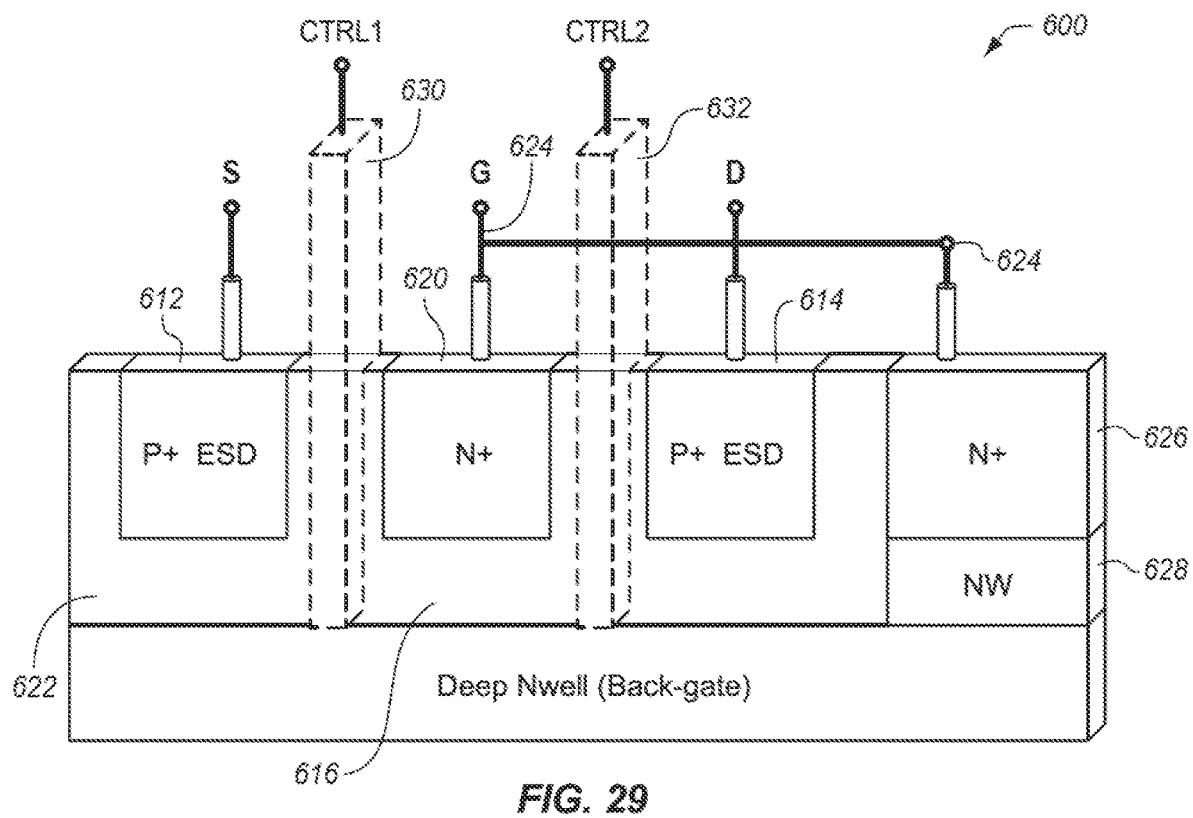
FIG. 29 is a cross-sectional side view diagram of a transistor on a finFET architecture according to an embodiment of the invention.

As shown in FIGS. 1-6, a variety of different devices may be formed using a fin architecture and solid surface annealing. The most simple device has a contact at each end of a current channel. The contacts can be coupled to an electrode or another device. This supplies an isolated electrical conduit between two points. The structure can be augmented by one or more control gates as shown in FIGS. 1 and 6. The structure can be augmented with transistor gates as shown in FIG. 29 or the device may have a combination of different types of gates. A variety of different types of transistor, resistor, and other current control devices can be formed using the techniques described herein.

Figure 7:
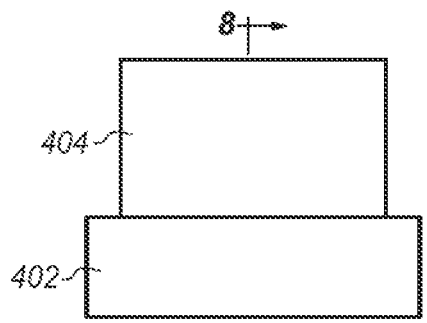
FIGS. 7-22 are cross-sectional side view and corresponding front view diagrams of stages of fabrication for the device of FIG. 1 according to an embodiment of the invention.
Figure 8:
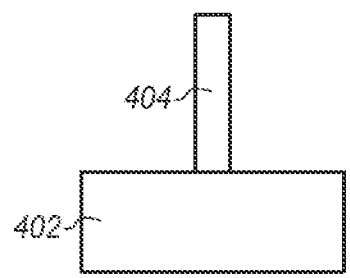

FIGS. 7-28 are cross-sectional side view diagrams and corresponding front view diagrams of stages of fabrication for a variable resistor described, for example, in FIGS. 1 and 5. In FIGS. 7 and 8 a substrate 402 such as a silicon substrate has been processed so that it has a fin 404 while only one fin is shown, typically a substrate will have many hundreds of fins or thousands depending upon the intended application.

Figure 9:
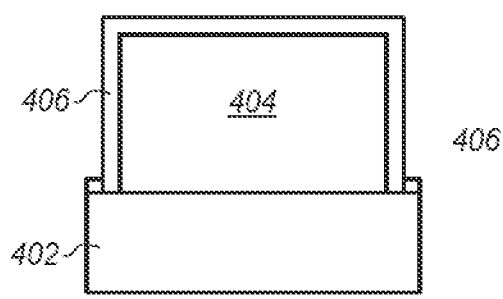
Figure 10:
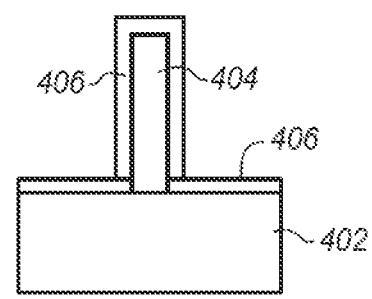

In FIGS. 9 and 10 an n doped glass is deposited over the substrate. The n-type glass 406 contains a doped oxide and may be in the form, for example, of a phosphosilicate. The glass may be applied by chemical vapor deposition or a variety of other processes.

Figure 11:
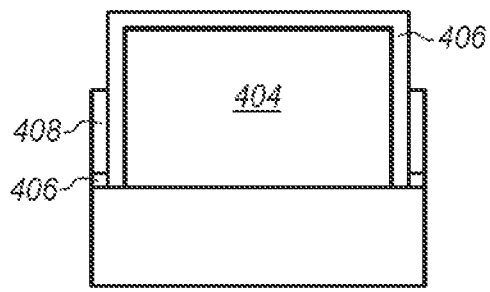
Figure 12:
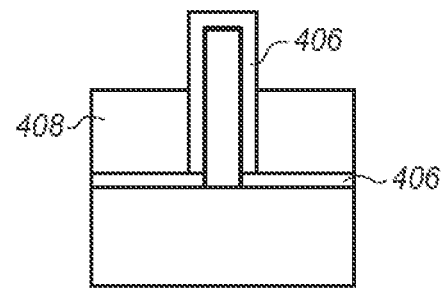

FIGS. 11 and 12 show that a spin-on hard mask 408 has been applied over the substrate and the glass as a thick blanket coat. The mask covers the substrate and a lower part of the fin. The mask layer leaves only the upper part of the fin exposed. The glass on the rest of the structure is covered.

A blanket coat of such a blocking material, by protecting some areas and not others, allows additional layers to be applied selectively.

Figure 13:
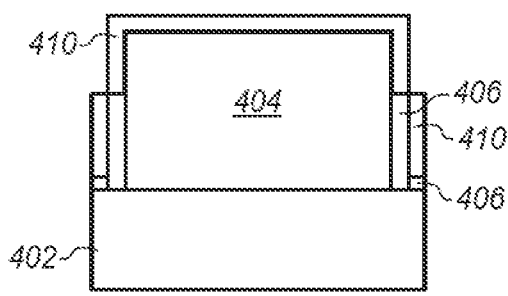
Figure 14:
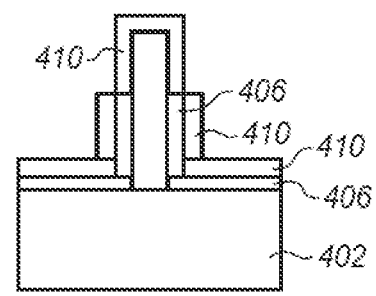

In this case, as shown in FIGS. 13 and 14 the spin-on hard mask has been used to protect the n-doped glass on the lower part of the fin and the substrate from an etch process. As a result, the n-doped glass applied to the top of the fin has been removed. As shown in FIGS. 13 and 14, the exposed top of the fin sets the depth of the p-type channel which is to be formed and also sets the back gate depth. In FIGS. 13 and 14 the glass over the upper part of the fin has been removed the carbon hard mask has been removed and a low doped p-type glass 410 has been deposited over the entire structure.

Figure 15:
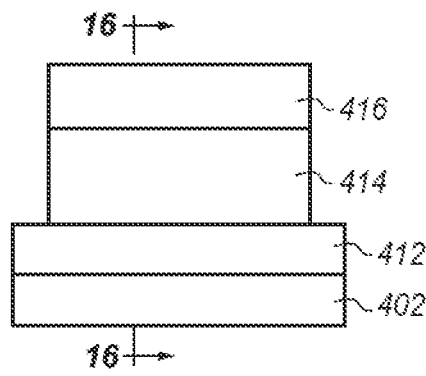
Figure 16:
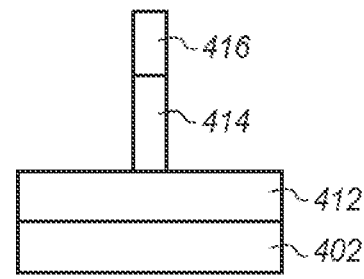

In FIGS. 15 and 16 the structure of FIGS. 13 and 14 has been annealed and all of the glass has then been removed. The anneal drives the dopants from the glass into the silicon or other thin material. The glass can then be removed using a standard oxide etching process or any of a variety of other processes. As a result of the glass deposition and annealing, the structure of FIGS. 15 and 16 has a lower silicon portion 402 with an n-type substrate area 412 and an n-type lower portion of the fin 414. Note that upper part of the substrate closest to the fin is also doped due to the n-type glass that was deposited over the substrate. This allows a very deep n-well to be formed under the p-channel at the top part of the fin. The top of the fin 416 is doped as p-type to later form a p-channel over a deep n-well.

In this example, the doped glass forms a solid source of dopants. The dopants are diffused into the fin from the solid source when the structure is annealed. The particular process parameters of this solid source diffusion may be adjusted to suit the particular materials, the desired doping levels, and the overall process flow for fabricating the devices. While doped glass is described other solid source diffusion methods and technologies may be used depending on the particular application and process parameters.

Figure 17:
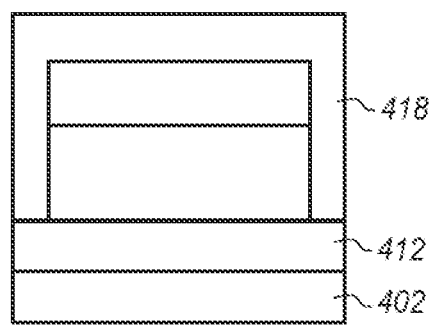
Figure 18:
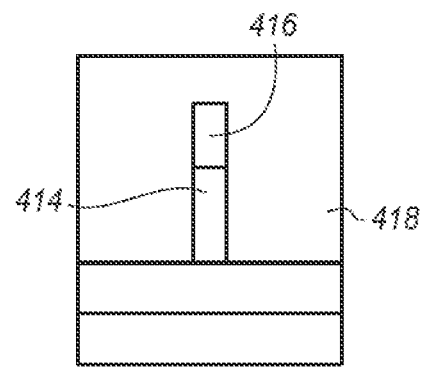

In FIGS. 17 and 18 an isolation oxide 418 is applied, this isolation oxide may be any of a variety of oxides including silicon dioxide. The oxide is then planarized in FIGS. 19 and 20 and patterned to allow a polysilicon control gate 420 structure to be applied over the fin. The polysilicon material may then be removed and backfilled with metal to form a metal control gate.

Figure 21:
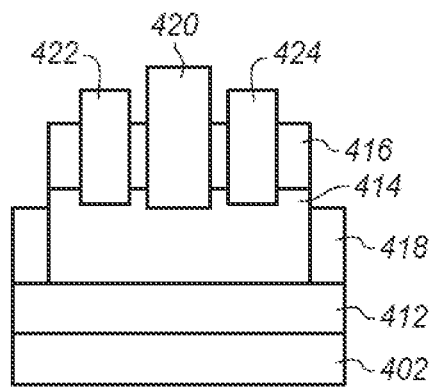
Figure 22:
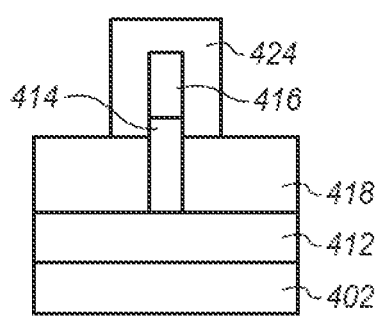

In FIGS. 21 and 22, contacts 420, 422 are applied over the fin and a spacer 426 is applied to separate the control gate 420 from the two contacts 422, 424. The spacers may be formed by deposition and may be left in place to control epitaxial growth which may be applied to the structure in a later process.

Figure 19:
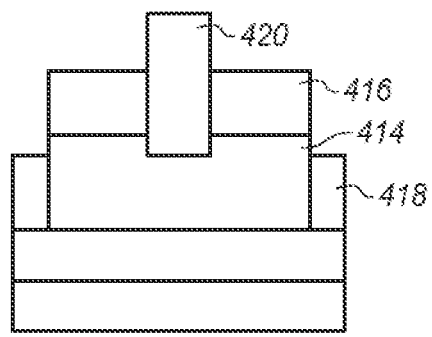
Figure 20:
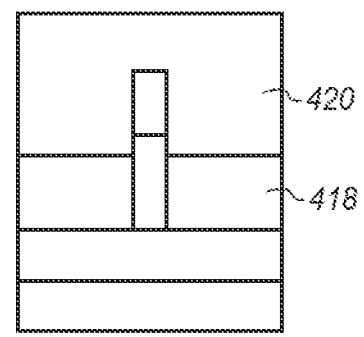

As shown in FIGS. 19 and 20, the control gate surrounds the fin on three sides, the top and two vertical sides of the fin. Similarly, the contacts 420, 422 also surround the fin on the top and both sides. As a result the current flow from the contact through the p-channel is maximized and the effect of the control gate on the p-channel is also maximized.

Figure 23:
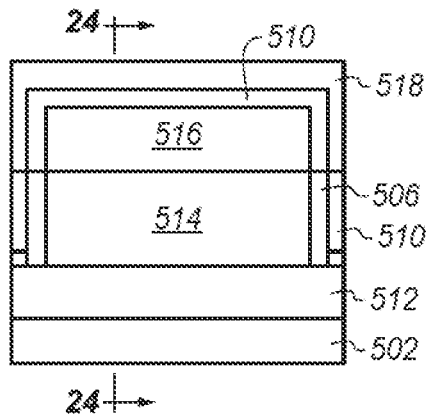
FIGS. 23-28 are cross-sectional side view and corresponding front view diagrams of alternative stages of fabrication for FIGS. 13-22 according to an embodiment of the invention.
Figure 24:
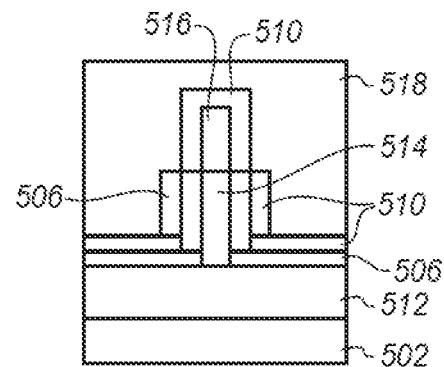

FIGS. 23 to 28 are side cross-sectional and corresponding front view diagrams of a stage of fabrication to show an alternative fabrication process. In the example of FIGS. 23 and 24, a deposition oxide has been applied over the structure of FIG. 4G. The structure of 4G has been formed and this structure has then been annealed. However, instead of then removing the doped glass from the structure, an oxide isolation layer 518 is applied over the fin, the substrate and the glass. As a result of the anneal, a portion 512 of the silicon substrate 502 is n-doped, a portion of the fin 514 and the substrate 512 forms the deep n-well with a more highly doped p-type channel 516 on the upper part of the fin. Due to the oxide isolation structure, the p-doped glass 510 covers the fin and the n-type glass 506 covers the fin and the substrate.

Figure 25:
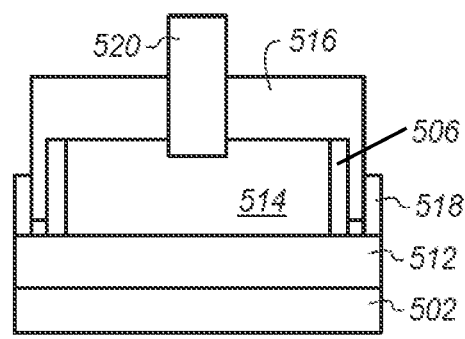
Figure 26:
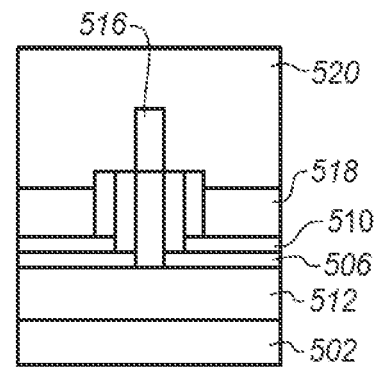

In FIGS. 25 and 26 the deposited oxide 518 has been planarized and removed down to below the n-well area or the start of the n-type portion of the fin 514. This exposes most of the fin. All of the deposited glass above the oxide layer 518 is then removed and a polysilicon structure 520 is formed over and around the fin to start the fabrication of the control gate.

Figure 27:
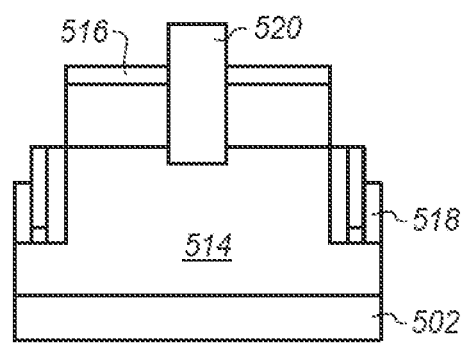
Figure 28:
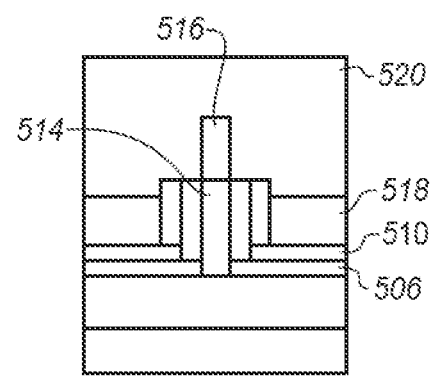

In FIGS. 27 and 28 the control gate has been formed, the extra oxide has been removed, and the device is in a preliminary stage ready for application of the contacts as shown in FIGS. 21 and 22. By applying the isolation oxide before removing the deposited glass layers, several steps in the fabrication process may be avoided, reducing costs.

FIG. 29 is a cross-sectional side view diagram of a transistor device formed on a fin of a FinFET architecture. As described above, solid-source diffusion may be used along with implantation to form contacts for a resistor. The same techniques may be used for the source 612, drain 614, and top back-gate contacts 626, 628 of a JFET. In a JFET 600 as shown in FIG. 29, current flows from a p-type source 612 to a p-type drain 614 through, in this case, a p-type channel 616 when a gate 620 between the source and drain is off. The p-channel, the source, gate and drain are all formed in a fin 622 of a FinFET device architecture. The n-type gate has a contact 624 that is also coupled to an n-type top gate 626 and a back gate 628 that are also formed on the fin electrically coupled to the p-channel but spaced apart from the source, gate, and drain.

As the gate voltage is increased, the n-type back 626 and top 620 gates deplete the narrow p-channel of carriers in between the source and the drain. This pinches off the channel and reduces the current that can flow from the source to the drain. A similar design may be applied to an n-type channel in a fin with an n-type source and drain and a p-type gate.

Using a fin-based architecture additional control gates 630, 632 similar to the control gate of the variable resistor described herein may be used to further enhance or retard current flow through the p-channel. The control gates may be formed inside the JFET on one or both sides of the gate. Similar to the variable resistor of FIG. 1, the control gates of FIG. 29 are fabricated over the fin covering the fin on the top and on two sides to substantially surround the p-channel.

Due to the nature of current conduction inside of the fin and the narrow width of the fin, the three sided enclosure of the gate enables excellent electrostatic control of the carrier density inside the fin. The control gate is able to alternately increase the carrier density through channel accumulation and decrease the carrier density though channel depletion depending on the bias applied. As described above, in this way the control gates are acting as a variable resistor built in to the fin-based JFET architecture. As JFETs are typically longer channel devices to sustain high voltage operation, these control gates typically have no added layout area penalty and improve the pinch-off voltage needed to fully shut off the channel.

Figure 30:
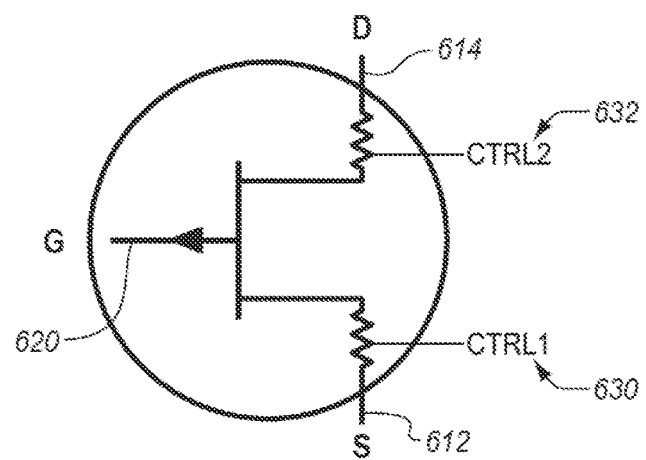
FIG. 30 is a circuit diagram of the transistor of FIG. 29 according to an embodiment of the invention.

FIG. 30 shows a corresponding circuit representation of the FinFET transistor showing the gate 620 to control current flow from the source 612 to the drain 614 and connections for the two control gates 630, 632.

An example process sequence on a 14 nm like technology is illustrated below. Standard processing is used to define the fins, and an n-type glass is subsequently deposited on top of the fins conformally. The glass is patterned using, for example a spin-on hardmask recessed to expose the top of the fins. A conformal p-type glass is then deposited. An anneal is performed to drive in the dopants from the glass into the silicon fins, and the glass is subsequently removed. Standard isolation oxide is deposited, planarized, and recessed to set the active fin height. The midsection gate spacers are then deposited.

In some embodiments, the spacer is completely or partially left on the fin to enable downstream epitaxial patterning of the JFET device. Epitaxial silicon undercut etch and growth may then be performed using conventional techniques and the gate isolation oxide may then be deposited to enable contact formation. The contacts for the source, drain, and gates are then constructed.

Figure 31:
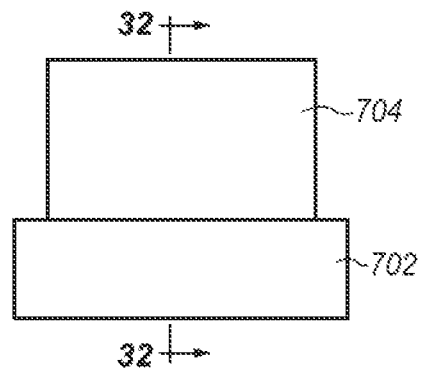
FIGS. 31-55 are cross-sectional side view and corresponding front view diagrams of alternative stages of fabrication of the transistor of FIG. 29 according to an embodiment of the invention.
Figure 32:
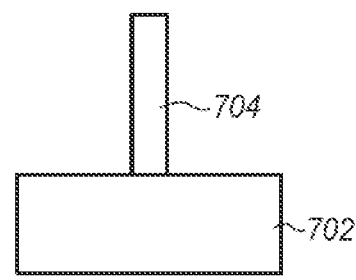
Figure 33:
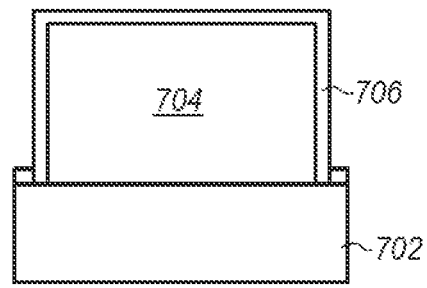
Figure 34:
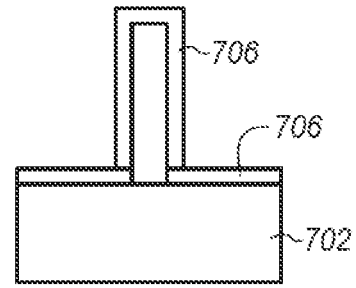

FIGS. 31-55 are cross-sectional side and front view diagrams of stages of fabrication of a JFET in a FinFET architecture. In FIGS. 31 and 32 a substrate 702 has one or more fins 704 formed on it. The fin may be formed in any of a variety of different ways depending on the particular implementation. In FIGS. 33 and 34 an n-type glass 706 is deposited over the fin and substrate. This glass may be formed by a variety of different deposition processes and contains a moderate dopant concentration of n-type dopant. As mentioned above borosilicate or phosphosilicate may be applied by chemical vapor deposition or any other technique may be used.

Figure 35:
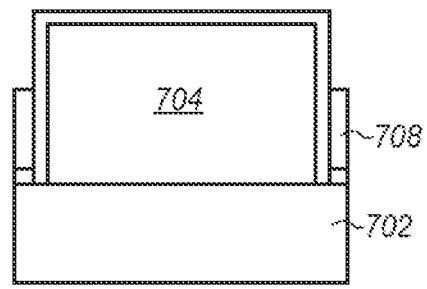
Figure 36:
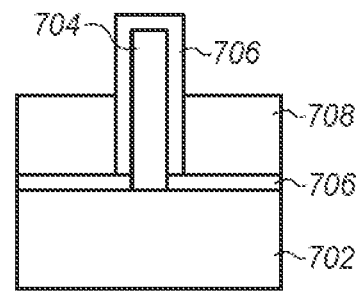

In FIGS. 35 and 36 a blocking material 708, such as a planarizing spin-on hard mask is applied and patterned over the substrate. In the illustrated example a thick blanket is used so that the top of the fin is exposed while the bottom of the fin and the top of the substrate are coated. The height of the mask layer determines the depth of the p-channel.

Figure 37:
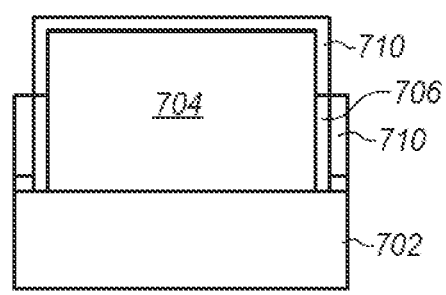
Figure 38:
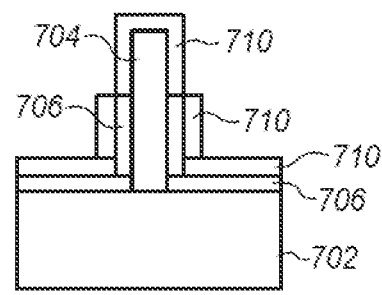

In FIGS. 37 and 38 the n-type glass has been removed where it is exposed, that is where it is not covered by the spin-on hard mask, and after the glass has been etched away the blocking material is also removed. A highly concentrated p-type doped glass is then applied over the entire fin and substrate. The p-type glass 710 will allow the fin to be doped as a p-type material to build the p-channel.

Figure 39:
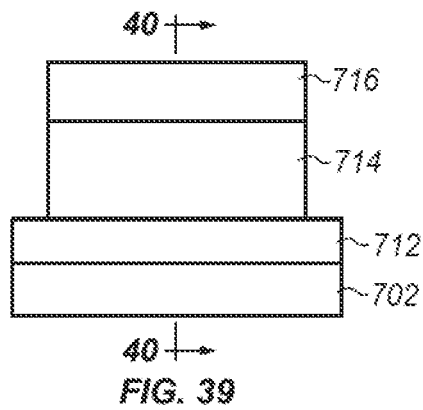
Figure 40:
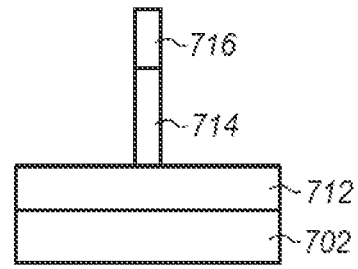

In FIGS. 39 and 40 the substrate, fin, and glass have been annealed. This drives dopants in from the glass into the silicon material. The glass is then removed using, for example, an oxide etch to leave the structure shown in FIGS. 39 and 40. This structure has a silicon substrate at its base and an n-doped well at the top of the substrate 712. In addition, the fin has a lower portion 714 that is also n-doped to form the back gate. The fin has an upper portion 716 which is p-doped to form the current flow channel.

Figure 41:
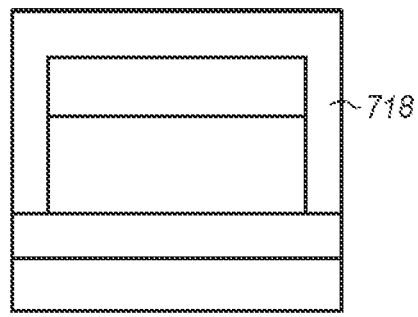
Figure 42:
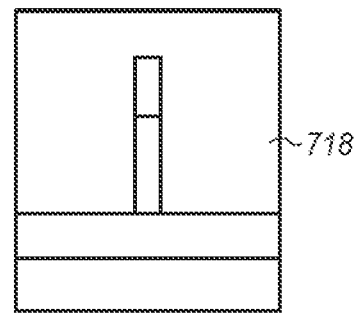
Figure 43:
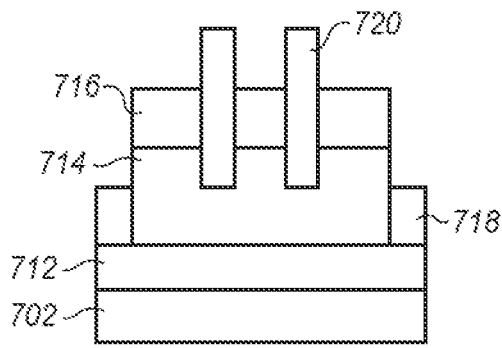
Figure 44:
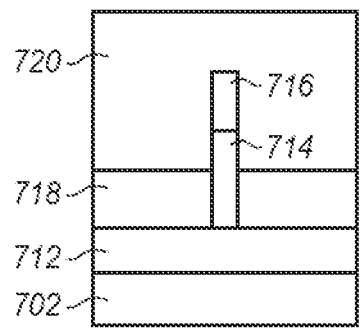

In FIGS. 41 and 42 the entire structure is covered with an oxide layer 718, such as silicon dioxide or another oxide. The oxide forms an isolation oxide which is then planarized to a determined level as shown in FIGS. 43 and 44 to expose a certain portion of the fin. The oxide is removed away to expose a portion of the part of the fin that is n-doped 714. As shown in FIGS. 43 and 44 the fin is exposed so that the entire p-channel is exposed as is a portion of the N doped back gate 714. A control gate 720 may then be formed around the entire exposed area of the fin down to the level of the oxide. The height or level of the oxide accordingly determines the size of the control gate. The control gate is deeper than the p-channel and covers the entire active fin height.

The control gates are typically metal and may be formed in any of a variety of different ways. In the illustrated example, the control gates are formed first by polysilicon patterning to build a structure corresponding to the desired shape 720 of the control gates. After the patterning is completed at this level the polysilicon is then removed leaving a void in the shape of the desired control gate. The void is then back filled with metal to form the control gate. Electrodes and other connectors may then be attached to the metal. In the illustrated example there are two control gates however there may be one or no control gates depending upon the intended final form of the JFET.

Figure 45:
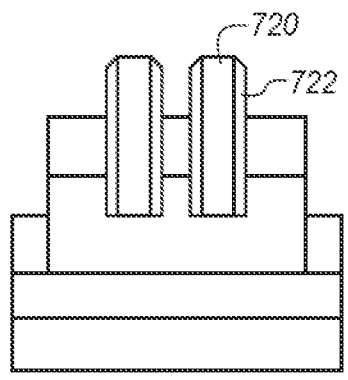
Figure 46:
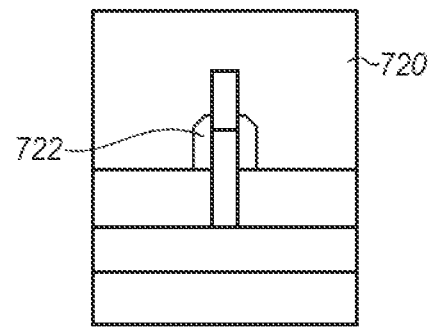

In FIGS. 45 and 46 a residual spacer has been applied to the fin to control subsequent epitaxial growth. The spacer 722 is applied around the base of the fin over the oxide layer which remains in place.

Figure 47:
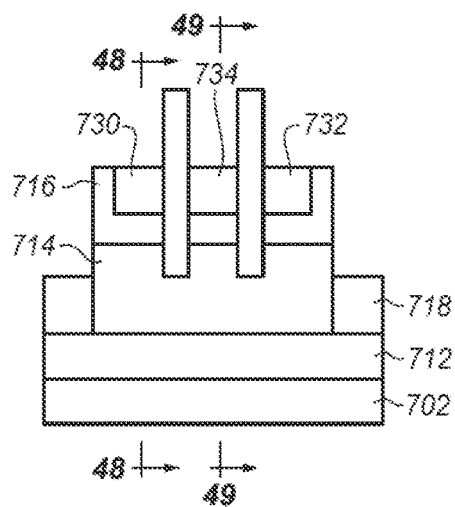
Figure 48:
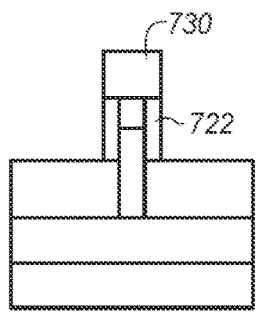
Figure 49:
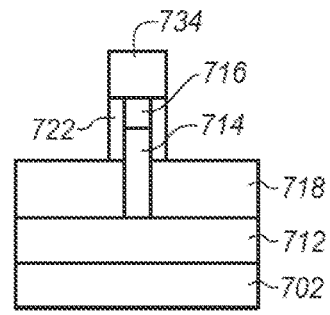
Figure 50:
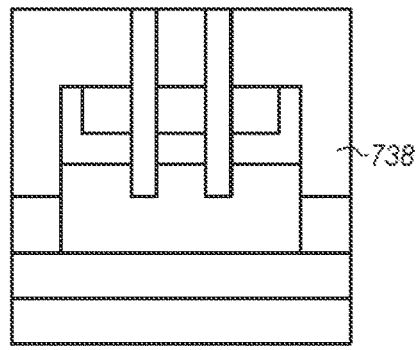
Figure 51:
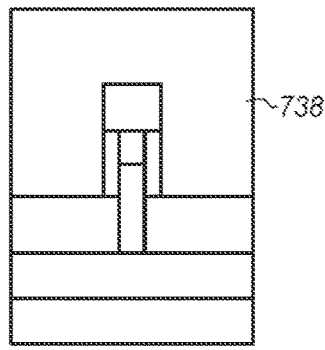
Figure 52:
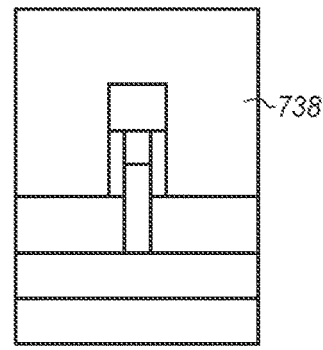
Figure 53:
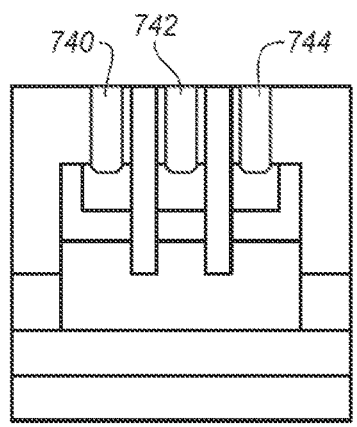
Figure 54:
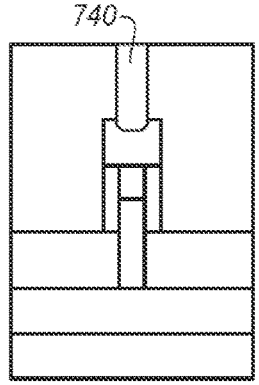
Figure 55:
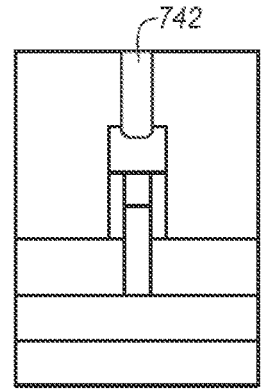

FIGS. 47 to 55 are cross-sectional side and front view diagrams of stages of further fabrication of the device of FIG. 29. In these figures source, gate, and drain are added. The cross-sectional front view of FIGS. 48, 51, and 54 are taken at the position of the source which is similar to the view at the drain. The front cross-sectional view of FIGS. 49, 52, and 55 are taken at the position of the gate, rather than at the position of the control gate as in FIGS. 31 to 46. This is because the control gates, at least in polysilicon form have already been formed and are not affected by the other stages.

In FIGS. 47, 48, and 49 the source gate and drain of the JFET have been formed. The source 730 and drain 732 are formed by epitaxial growth of a p-type element and the gate 734 is formed by n-type epitaxial growth. The source and drain are formed over the fin and the spacer using patterning and epitaxial growth. The source and drain are prevented by the spacer 722 from coming into contact with or coming too close to the deep n-well or back gate 714 of the fin. As a result, each contact node makes contact only with the p-channel. The source and drain can be formed by applying a doped material over the p-channel or by doping the actual p-channel. Similarly, the n-type gate is formed in the fin or over the fin and is blocked by the fin spacer 722 from coming too close to the n-type back gate. On the other hand, as shown in FIG. 22 for example the control gate wraps all the way around the p-channel and is physically contacting the n-type back gate.

As illustrated a first control gate is between and in contact with the source and the gate and the second control gate is between and in contact with the gate and the drain. As shown, an isolation barrier is applied over and surrounding the control gates to prevent conduction and electrical contact between the control gates and the source, gate, and drain. The control gates may be isolated with any of variety of dielectric barriers and may also be physically spaced apart from any other structure.

In FIGS. 50, 51, and 52 the entire structure is covered in a deep layer of isolation oxide 738 this isolates the source, gate, and drain as well as the control gates from each other. The top layer of the isolation oxide may be planarized using any of a variety of different processes to be, for example, at the level of the top of the control gates, electrodes and other structures. The fin, together with the source, gate, and drain are well below the isolation oxide in this example.

In FIGS. 53, 54, and 55 contacts are formed over the gates, these contacts 740, 742 and 744 allow connections to be made to the source, gate, and drain of the transistor device. In addition, the polysilicon control gates may be dissolved and backfilled with metal depending upon the particular implementation for the control gates. The top layer of dielectric 738 may be used as an interlayer dielectric in the event that additional components are to be formed over the JFET structure. The electrodes may be formed of any of a variety of different materials depending on the fabrication technology including tungsten.

As described, a very common and widely used transistor type (JFET) may be used in a SoC, power application, or other type of IC that is fabricated using a non-planar transistor process technology. Furthermore, the resistor or JFET device provides unique FinFET transport characteristics that are not seen in a planar fabrication technology.

Figure 56:
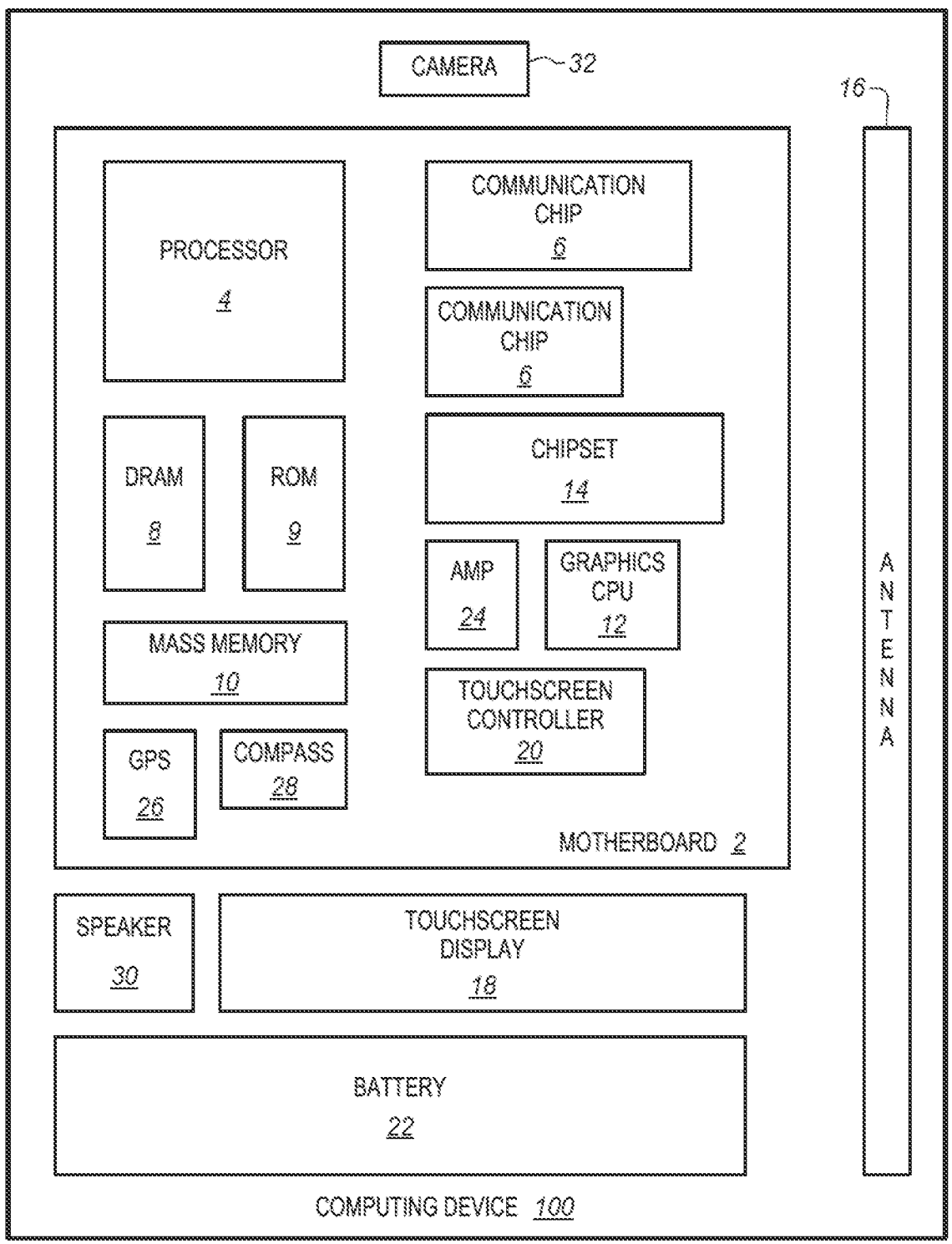
FIG. 56 is a block diagram of a computing device incorporating an integrated circuit built with a FinFET architecture and including a solid source diffused junction according to an embodiment.

FIG. 56 illustrates a computing device 100 in accordance with one implementation of the invention. The computing device 100 houses a system board 2. The board 2 may include a number of components, including but not limited to a processor 4 and at least one communication package 6. The communication package is coupled to one or more antennas 16. The processor 4 is physically and electrically coupled to the board 2. In some implementations of the invention, any one or more of the components, controllers, hubs, or interfaces are constructed using a FinFET architecture that includes solid source-diffused junctions.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, a camera 32, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The processor 4 of the computing device 100 includes an integrated circuit die packaged within the processor 4. The term "processor" may refer to any device or portion of a device that processes electronic data from registers and/or memory to transform that electronic data into other electronic data that may be stored in registers and/or memory.

In various implementations, the computing device 100 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. The computing device may be fixed, portable, or wearable. In further implementations, the computing device 100 may be any other electronic device that processes data.

Embodiments may be implemented as a part of one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) of the invention so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a method including forming a fin on a substrate, depositing a glass of a first dopant type over the substrate and over a lower portion of the fin, depositing a glass of a second dopant type over the substrate and the fin, annealing the glass to drive the dopants into the fin and the substrate, removing the glass, and forming a first and a second contact over the fin without contacting the lower portion of the fin.

Further embodiments include forming a control gate over the fin, the control gate being a conductive material over the top and on the sides of the fin to control current flow through the fin between the first and second contacts.

In further embodiments, forming a control gate comprises patterning polysilicon over the fin, removing the polysilicon and backfilling the void from the polysilicon with metal. Forming a control gate comprises forming a control gate over the fin after removing the glass and before forming the first and second contacts. The first contact comprises a source, the second contact comprises a drain, the method further comprising forming a gate over the fin between the source and the drain without contacting the lower portion of the fin.

Further embodiments include depositing an oxide over the silicon substrate after removing the glass, the oxide having a depth to cover the lower portion of the fin, the oxide isolating the lower portion of the fin before forming the doped source, gate, and drain.

Further embodiments include forming an isolation spacer over the lower portion of the fin before forming the source, gate, and drain to prevent the source, gate, and drain from contacting the lower portion of the fin.

In further embodiments, the substrate and the fin are silicon.

In further embodiments depositing a glass of a first dopant type includes depositing the glass of the first dopant type over the substrate and the fin, depositing a blocking material (carbon hard mask) over the substrate and a portion of the fin, removing the deposited glass that is not covered in the blocking material, and removing the blocking material.

In further embodiments the blocking material is a carbon hard mask. Depositing glass of a second dopant type comprises removing the glass of the first dopant type from a portion of the fin and depositing the glass of the second dopant type over the portion of the fin and over the glass of the first dopant type. Removing the glass comprises removing the glass using an oxide etcher.

Further embodiments include forming a control gate over the fin, the control gate being a conductive material over the top and on the sides of the fin to control current flow through the fin between the source and the drain.

In further embodiments, forming a control gate comprises patterning polysilicon over the fin, removing the polysilicon and backfilling the void from the polysilicon with metal. Forming a control gate comprises forming a control gate over the fin after removing the glass and before forming the source, gate, and drain.

Some embodiments pertain to an apparatus including a substrate, a fin above the substrate, the fin having a channel of a first dopant type and at least a portion of a well of a second dopant type, and a first contact and a second contact of the fin formed without contacting the well of the fin;

Further embodiments include a control gate between the first and second contact formed over and around the fin to control resistance between the first and the second contact.

In further embodiments, the control gate is metal. The control gate is formed of polysilicon which is then removed and a void caused by removing the polysilicon is filled with metal. The first and the second contacts are formed of the first dopant type. The first and second contacts are formed over the fin of epitaxial growth. The first and second contacts are formed in the fin of a dopant in the fin. The channel of the first dopant type is a current channel between the first and second contacts. The control gate extends over and around the channel of the fin on two sides.

In further embodiments, the first contact comprises a source and the second contact comprises a drain, the apparatus further comprising a gate of the second dopant type formed of the fin between the source and the drain formed without contacting the well of the fin.

In further embodiments, the gate is formed over the fin of epitaxial growth. The gate is formed in the fin of a dopant in the fin. The gate is formed in the fin by depositing a doped glass over the fin, annealing the glass, and removing the glass. The channel of the first dopant type is a current channel between the source and the drain and wherein a voltage applied to the gate determines whether current flows in the channel.

Further embodiments include a control gate between the source and the drain, the control gate extending over and around the channel of the fin on two sides and being configured to restrict current flow through the channel.

In further embodiments, the control gate is between the source and the gate, the transistor further comprising a second control gate between the gate and the drain. The control gate is metal. The control gate is formed of polysilicon which is then removed and a void caused by removing the polysilicon is filled with metal.

Some embodiments pertain to a computing system including a communication chip, a power supply and a processor having a plurality of transistors, at least one transistor being a junction gate field effect transistor having a substrate, a fin above the substrate, the fin having a channel of a first dopant type and at least a portion of a well of a second dopant type, a source and a drain of the first dopant type of the fin formed without contacting the well of the fin, and a gate of the second dopant type formed of the fin between the source and the drain formed without contacting the well of the fin.

In further embodiments, the gate is formed in the fin by depositing a doped glass over the fin, annealing the glass, and removing the glass. The junction gate field effect transistor further includes a control gate between the source and the gate, the control gate being formed over and around the fin to control resistance between the source and the drain. The control gate is formed by patterning polysilicon over the fin, removing the polysilicon and backfilling the void from the polysilicon with metal.

Some embodiments pertain to a junction gate field effect transistor including a substrate, a fin above the substrate, the fin having a channel of a first dopant type and at least a portion of a well of a second dopant type, a source and a drain of the first dopant type of the fin formed without contacting the well of the fin, and a gate of the second dopant type formed of the fin between the source and the drain formed without contacting the well of the fin.

Some embodiments pertain to a variable resistor including a substrate, a fin above the substrate, the fin having a channel of a first dopant type and at least a portion of a well of a second dopant type, a first contact and a second contact of the fin formed without contacting the well of the fin, and a control gate between the first and second contact formed over and around the fin to control resistance between the first and the second contact.

The invention claimed is:
1. An integrated circuit structure, comprising:
a channel structure comprising silicon, the channel structure having a lower channel structure portion and an upper channel structure portion;
a layer comprising a phosphosilicate glass (PSG), the layer comprising the PSG directly on first and second sidewalls of the lower channel structure portion of the channel structure, the layer comprising the PSG having a first upper end portion laterally adjacent to the first sidewall of the lower channel structure portion of the channel structure, and the layer comprising the PSG having a second upper end portion laterally adjacent to the second sidewall of the lower channel structure portion of the channel structure;
an isolation material comprising oxygen, the isolation material laterally adjacent to the layer comprising the PSG directly on the first and second sidewalls of the lower channel structure portion of the channel structure, the isolation material having a first upper surface portion and a second upper surface portion, wherein the first upper surface portion of the isolation material is below the first upper end portion of the layer comprising the PSG, and wherein the second upper surface portion of the isolation material is below the second upper end portion of the layer comprising the PSG; and
a gate electrode over and around the upper channel structure portion of the channel structure, and the gate electrode over the first and second upper end portions of the layer comprising the PSG, and the gate electrode over the first and second upper surface portions of the isolation material.

2. The integrated circuit structure of claim 1, wherein the first upper surface portion of the isolation material is laterally adjacent to the layer comprising the PSG on the first sidewall of the lower channel structure portion of the channel structure.

3. The integrated circuit structure of claim 2, wherein the second upper surface portion of the isolation material is laterally adjacent to the layer comprising the PSG on the second sidewall of the lower channel structure portion of the channel structure.

4. The integrated circuit structure of claim 1, further comprising:
an insulating layer directly laterally adjacent to the layer comprising the PSG directly on the first and second sidewalls of the lower channel structure portion of the channel structure, wherein the isolation material is directly laterally adjacent to the insulating layer.

5. The integrated circuit structure of claim 4, wherein the insulating layer comprises a borosilicate glass (BSG).

6. The integrated circuit structure of claim 4, wherein the insulating layer has a first upper end portion laterally adjacent to the first upper end portion of the layer comprising the PSG, and wherein the insulating layer has a second upper end portion laterally adjacent to the second upper end portion of the layer comprising the PSG.

7. The integrated circuit structure of claim 6, wherein the first upper end portion of the insulating layer is substantially co-planar with the first upper end portion of the layer comprising the PSG, and wherein the second upper end portion of the insulating layer is substantially coplanar with the second upper end portion of the layer comprising the PSG.

8. The integrated circuit structure of claim 6, wherein the first upper surface portion of the isolation material is below the first upper end portion of the insulating layer, and wherein the second upper surface portion of the isolation material is below the second upper end portion of the insulating layer.

9. The integrated circuit structure of claim 6, wherein the gate electrode is over the first and second upper end portions of the insulating layer.

10. The integrated circuit structure of claim 1, wherein the first upper end portion of the layer comprising the PSG is substantially co-planar with the second upper end portion of the layer comprising the PSG.

11. The integrated circuit structure of claim 10, wherein the first upper surface portion of the isolation material is substantially co-planar with the second upper surface portion of the isolation material.

12. An integrated circuit structure, comprising:
a channel structure comprising silicon, the channel structure having a lower channel structure portion and an upper channel structure portion;
a dielectric layer comprising an N-type dopant, the dielectric layer directly on first and second sidewalls of the lower channel structure portion of the channel structure, the dielectric layer having a first upper end portion laterally adjacent to the first sidewall of the lower channel structure portion of the channel structure, and the dielectric layer having a second upper end portion laterally adjacent to the second sidewall of the lower channel structure portion of the channel structure;
an isolation material comprising oxygen, the isolation material laterally adjacent to the dielectric layer directly on the first and second sidewalls of the lower channel structure portion of the channel structure, the isolation material having a first upper surface portion and a second upper surface portion, wherein the first upper surface portion of the isolation material is below the first upper end portion of the dielectric layer, and wherein the second upper surface portion of the isolation material is below the second upper end portion of the dielectric layer; and
a gate electrode over and around the upper channel structure portion of the channel structure, and the gate electrode over the first and second upper end portions of the dielectric layer, and the gate electrode over the first and second upper surface portions of the isolation material.

13. The integrated circuit structure of claim 12, wherein the N-type dopant is phosphorous.

14. The integrated circuit structure of claim 12, wherein the first upper surface portion of the isolation material is laterally adjacent to the dielectric layer on the first sidewall of the lower channel structure portion of the channel structure.

15. The integrated circuit structure of claim 14, wherein the second upper surface portion of the isolation material is laterally adjacent to the dielectric layer on the second sidewall of the lower channel structure portion of the channel structure.

16. The integrated circuit structure of claim 12, further comprising:
an insulating layer directly laterally adjacent to the dielectric layer directly on the first and second sidewalls of the lower channel structure portion of the channel structure, wherein the isolation material is directly laterally adjacent to the insulating layer.

17. The integrated circuit structure of claim 16, wherein the insulating layer comprises a borosilicate glass (BSG).

18. The integrated circuit structure of claim 16, wherein the insulating layer has a first upper end portion laterally adjacent to the first upper end portion of the dielectric layer, and wherein the insulating layer has a second upper end portion laterally adjacent to the second upper end portion of the dielectric layer.

19. The integrated circuit structure of claim 18, wherein the first upper end portion of the insulating layer is substantially co-planar with the first upper end portion of the dielectric layer, and wherein the second upper end portion of the insulating layer is substantially co-planar with the second upper end portion of the dielectric layer.

20. The integrated circuit structure of claim 18, wherein the first upper surface portion of the isolation material is below the first upper end portion of the insulating layer, and wherein the second upper surface portion of the isolation material is below the second upper end portion of the insulating layer.

21. The integrated circuit structure of claim 18, wherein the gate electrode is over the first and second upper end portions of the insulating layer.

22. The integrated circuit structure of claim 12, wherein the first upper end portion of the dielectric layer is substantially co-planar with the second upper end portion of the dielectric layer.

23. The integrated circuit structure of claim 22, wherein the first upper surface portion of the isolation material is substantially co-planar with the second upper surface portion of the isolation material.

* * * * *